(12) United States Patent
Ishida et al.

(10) Patent No.: US 7,855,429 B2
(45) Date of Patent: Dec. 21, 2010

(54) ELECTRONIC CIRCUIT DEVICE HAVING SILICON SUBSTRATE

(75) Inventors: Makoto Ishida, 13-3, Noyoridal 1-chome, Toyohashi-shi, Aichi (JP); Kazuaki Sawada, Toyohashi (JP); Hidekuni Takao, Toyohashi (JP); Minoru Sudo, Chiba (JP)

(73) Assignees: Makoto Ishida; Seiko Instruments Inc.

( * ) Notice: Subject to any disclaimer, the term of this patent is extended or adjusted under 35 U.S.C. 154(b) by 0 days.

(21) Appl. No.: 12/288,814

(22) Filed: Oct. 23, 2008

(65) Prior Publication Data
US 2009/0065894 A1  Mar. 12, 2009

Related U.S. Application Data

(62) Division of application No. 11/093,614, filed on Mar. 30, 2005, now abandoned.

(30) Foreign Application Priority Data
Mar. 31, 2004  (JP) .............................. 2004-105220

(51) Int. Cl.
*H01L 29/00*  (2006.01)
*H01L 23/02*  (2006.01)

(52) U.S. Cl. ............... 257/528; 257/678; 257/E29.001; 257/E21.505; 257/E23.062

(58) Field of Classification Search ................. 257/528, 257/678, 734, 758, E29.001, E21.505, E23.178, 257/E25.023, E23.004, E23.008, E23.062, 257/E23.065, E23.069, E23.172, E23.174; 438/597
See application file for complete search history.

(56) References Cited

U.S. PATENT DOCUMENTS

2006/0076661 A1*  4/2006  Savastiouk et al. .......... 257/678

* cited by examiner

*Primary Examiner*—Victor A Mandala
*Assistant Examiner*—Whitney Moore
(74) *Attorney, Agent, or Firm*—Adams & Wilks

(57) ABSTRACT

An electronic circuit device comprises a silicon substrate having front and rear surfaces, a semiconductor element formed on the front surface, and at least one through-hole penetrating through the front surface and the rear surface. At least one passive element is supported by the silicon substrate. At least one connecting element is disposed in the through-hole of the silicon substrate for electrically connecting the semiconductor element to the passive element.

14 Claims, 10 Drawing Sheets

US 7,855,429 B2

ELECTRONIC CIRCUIT DEVICE HAVING SILICON SUBSTRATE

CROSS-REFERENCE TO RELATED APPLICATIONS

This application is a divisional application of U.S. patent application Ser. No. 11/093,614 filed Mar. 30, 2005 now abandoned and claiming a priority date of Mar. 31, 2004.

BACKGROUND OF THE INVENTION

1. Field of the Invention

The present invention relates to an electronic circuit device in which a passive element or a sensor element is combined with a silicon substrate.

2. Description of the Related Art

FIG. 19 shows a structure of a conventional electronic circuit device in which a passive element is combined with a silicon substrate (for example, refer to JP 09-8180A (FIG. 1)).

A group of active components 100 made on a silicon substrate and a group of passive components 101 are mounted on a surface of an insulating substrate 102. A circuit pattern (not shown in the figure) is printed on a front surface of the insulating substrate 102, and the circuit pattern electrically connects the active components (diode, transistor, IC, or the like) 100 to the passive components (resistor, capacitor, inductor, or the like) 101.

The conventional electronic circuit device combining passive elements with a silicon substrate consequently has a problem of a mounting area and a volume becoming large.

SUMMARY OF THE INVENTION

The present invention has been made to solve the above mentioned problem, and has an object to provide an electronic circuit device in which passive elements are combined with a silicon substrate in a small area and volume.

According to the present invention, an electronic circuit device in which a passive element is combined with a silicon substrate is provided, comprising: a silicon substrate having a semiconductor element and a recess; and at least one passive element which is formed by a process different from a silicon planar process by which the semiconductor element is formed, wherein the passive element is entrenched in the recess of the silicon substrate and is electrically connected to the semiconductor element formed on the silicon substrate.

Also, an electronic circuit device in which a passive element is combined with a silicon substrate is provided, comprising: a silicon substrate having a semiconductor element and a recess; and at least one passive element which is formed by a process different from a silicon planar process by which the semiconductor element is formed, wherein the recess of the silicone substrate serves as a connector which electrically connects the passive element with the semiconductor element when the passive element is inserted into the recess.

Also, an electronic circuit device in which a passive element is combined with a silicon substrate is provided, comprising: a silicon substrate having a semiconductor element on a front surface thereof and at least one through hole which penetrates through the front surface and the back surface; at least one passive element which is formed by a process different from a silicon planar process by which the semiconductor element is formed; and a connecting element disposed in the through hole for electrically connecting the semiconductor element to the passive element, wherein the surface of the connecting element is comprised of an insulating resin.

Also, an electronic circuit device in which a passive element is combined with a silicon substrate is provided, comprising: a silicon substrate having a semiconductor element on a front surface thereof, a recess on a back surface thereof and at least one through hole which penetrates through the front surface and the back surface in the recess; and at least one passive element which is formed by a process different from a silicon planar process by which the semiconductor element is formed and which is disposed in the recess; and a connecting element disposed in the through hole for electrically connecting the semiconductor element to the passive element, wherein the surface of the connecting element is comprised of an insulating resin.

Also, an electronic circuit device in which a passive element is combined with a silicon substrate is provided, comprising: a silicon substrate having a semiconductor element on a front surface thereof and at least one through hole which penetrates through the front surface and the back surface; and at least one passive element which is formed by a process different from a silicon planar process by which the semiconductor element is formed and which has a protruded terminal fitting for the through hole, wherein the protruded terminal of the passive element is entrenched in the through hole from the back surface of the silicon substrate to electrically connect the passive element with the semiconductor element formed on the front surface of the silicon substrate.

Also, an electronic circuit device in which a passive element is combined with a silicon substrate is provided, comprising: a silicon substrate having a semiconductor element on a front surface thereof, a recess on a back surface thereof and at least one through hole which penetrates through the front surface and the back surface in the recess; and at least one passive element which is formed by a process different from a silicon planar process by which the semiconductor element is formed and which is disposed in the recess and which has a protruded terminal fitting for the through hole, wherein the protruded terminal of the passive element is entrenched in the through hole from the back surface of the silicon substrate to electrically connect the passive element with the semiconductor element formed on the front surface of the silicon substrate.

Also, the electronic circuit device according to the present invention comprises: a silicon substrate which includes a rectifying element and a capacitor and is formed with a recess; and at least one antenna which has a protruded electrode fit into the recess of the silicon substrate, and is formed by a process different from a silicon planar process, and is characterized in that: the protruded electrode of the antenna is inserted into the recess of the silicon substrate; the rectifying element formed on the silicon substrate is electrically connected to the antenna; and energy is stored by utilizing commercial radio waves.

Also, an electronic circuit device in which a passive element is combined with a silicon substrate is provided, comprising: a silicon substrate having a rectifying element, a capacitor, and a recess; and at least one antenna which is formed by a process different from a silicon planar process by which the rectifying element and the capacitor are formed and which has a protruded terminal fitting for the recess, wherein the protruded terminal of the antenna is entrenched in the recess of the silicon substrate to electrically connect the antenna with the rectifying element formed on the surface of the silicon substrate and energy is stored by utilizing commercial radio waves.

DETAILED DESCRIPTION OF THE PREFERRED EMBODIMENTS

According to the present invention, the silicon substrate is provided with a recess, and a passive element or a sensor is entrenched in the recess in order to solve the above-mentioned problem in an electronic circuit device in which a passive element is combined with a silicon substrate.

Embodiment 1

Figure 1:
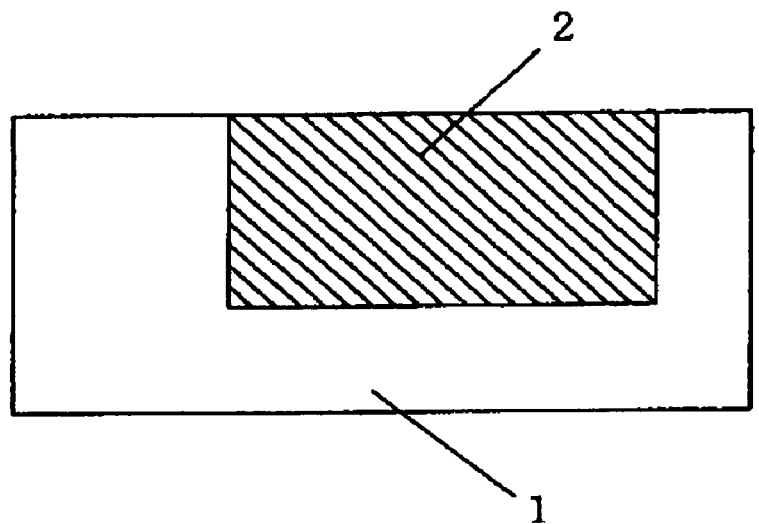
FIG. 1 is a sectional view of an electronic circuit device having a silicon substrate according to Embodiment 1 of the present invention.

Hereinafter, description will be made of embodiments of the present invention with reference to the accompanying drawings. FIG. 1 is a sectional view of an electronic circuit device having a silicon substrate according to Embodiment 1 of the present invention.

A silicon substrate 1 has a front surface and a back surface. The upper side of FIG. 1 corresponds to the front surface, and the lower side thereof corresponds to the back surface. On the front surface of the silicon substrate 1, elements, which are not shown in the figure, such as a transistor, a resistor, and a capacitor are formed by using a silicon planar process, which is a technology of directly forming an integrated circuit on a semiconductor substrate adopting methods of deposition, etching, doping, heat treatment, and the like.

Further, a hole in the form of a recess is formed on the front surface of the silicon substrate 1 by anisotropic silicon dry etching such as DRIE (Deep Reactive Ion Etching) or anisotropic wet etching such as TMAH (Tetra Methyl Ammonium Hydroxide). In general, the recess is formed substantially perpendicular to the silicon substrate as shown in FIG. 1 in the case of DRIE, and is formed to have a certain angle in the case of wet etching.

The depth and size of the recess are adjusted depending on the size of a passive element 2 to be entrenched in the recess. In FIG. 1, the part where the passive element 2 is inserted in the silicon substrate 1 corresponds to the recess. In the case where the thickness of the silicon substrate 1 is thinner than the thickness of the passive element 2, the passive element 2 is protruded from the front surface of the silicon substrate 1.

A resistor or a capacitor can be made on a silicon substrate 1 by using the silicon planar process; however, it is difficult to form a capacitor with a large capacitance or a coil with a high inductance by using the silicon planar process. In the present invention, a high performance passive element 2, which is formed as a separate member by a process different from the silicon planar process for forming an element on a semiconductor surface, is entrenched in the recess of the silicon substrate 1. Consequently, a capacitor with a large capacitance or a coil with high inductance, both of which cannot be realized through the conventional silicon planar process, can be used in an electronic circuit formed by semiconductor elements on a silicon substrate. The size of the electronic circuit device can accordingly be reduced.

Now a number of methods of fixing the passive element 2 to the silicon substrate 1 are described.

Figure 2:
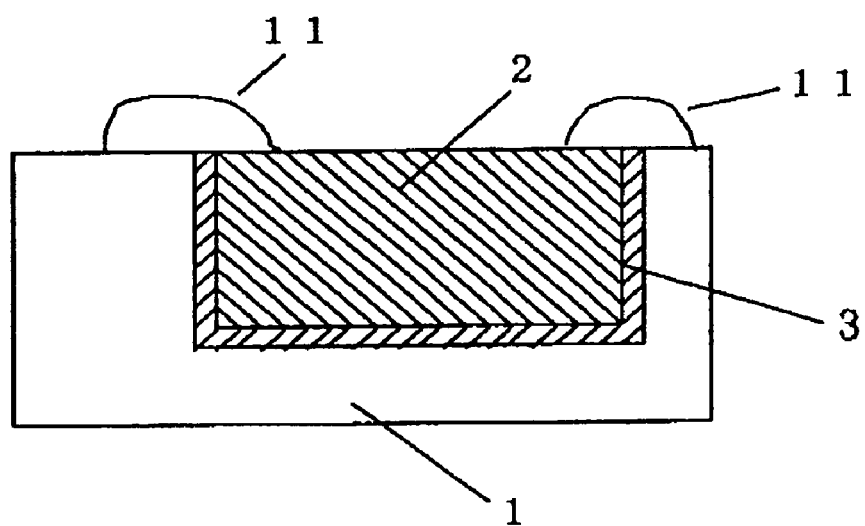
FIG. 2 is a sectional view of the electronic circuit device having a silicon substrate according to Embodiment 1 of the present invention.

A first method is related to a case when a terminal of the passive element exists on the side of the front surface of the silicon substrate, and is a method of injecting an adhesive 3 into the recess of the silicon substrate. In this case, first, a proper amount of the adhesive 3 is injected into the silicon substrate 1 formed with the recess, and the passive element 2 is inserted into the recess, thereby being adhered to the silicon substrate 1. After adhesion, as shown in FIG. 2, the terminal of the passive element can be electrically connected to the element on the silicon substrate through wire bonding 11.

Figure 3:
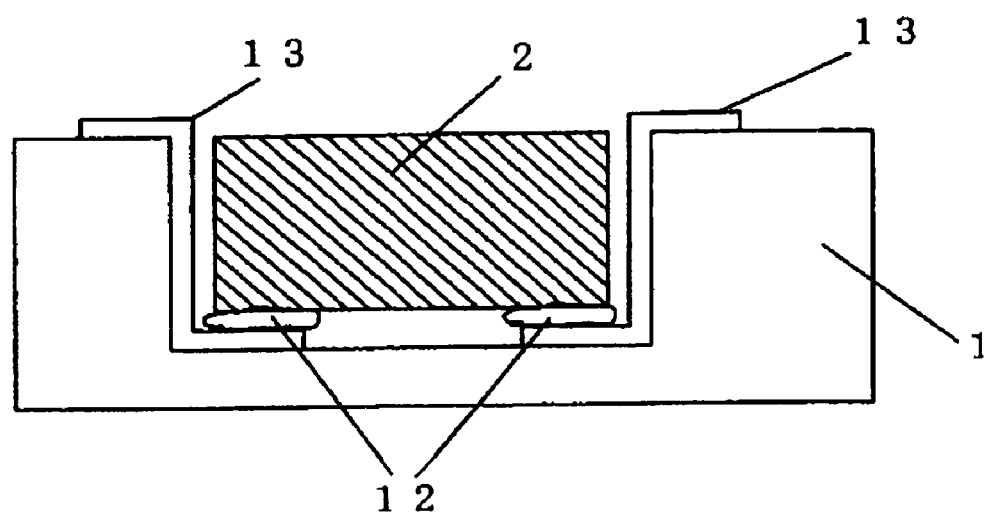
FIG. 3 is a sectional view of the electronic circuit device having the silicon substrate according to Embodiment 1 of the present invention.

A second method is related to a case when the terminals of the passive element exist on the side of the recess of the silicon substrate, as shown in FIG. 3, and is a method in which a low-melting metal or conductive adhesive 12 is arranged to parts, with which the terminals of the passive element contact, in the recess of the silicon substrate. In this case, metal interconnect, interconnect by diffusion at high concentration, or polysilicon interconnect 13 for electrical conduction is formed in advance at the parts, with which the terminals of the passive element contact, of the silicon substrate 1 formed with the recess. The interconnection extends from a connecting point with the terminal of the passive element to the semiconductor surface, and is electrically connected with the element on the silicon substrate on the semiconductor surface.

After the conductive adhesive 12 is arranged in the recess of the silicon substrate, the passive element 2 is inserted into the recess. Heat application is generally used as a method of hardening a low-melting metal or conductive adhesive. However, hardening by heat generated by an application of a supersonic wave can be also adopted as the hardening method.

Embodiment 2

Figure 4:
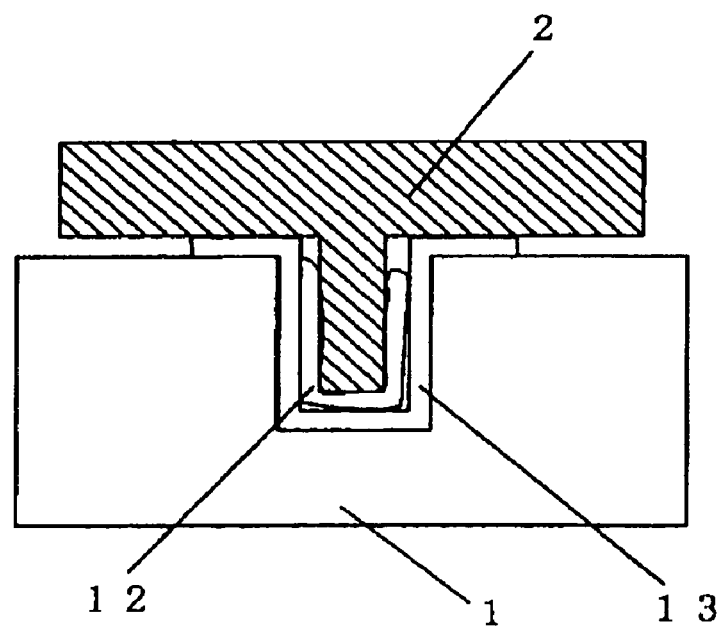
FIG. 4 is a sectional view of an electronic circuit device having a silicon substrate according to Embodiment 2 of the present invention.

FIG. 4 is a sectional view of an electronic circuit device having a silicon substrate according to Embodiment 2 of the present invention. The silicon substrate 1 has a front surface and a back surface. The upper side of FIG. 4 corresponds to the front surface, and the lower side thereof corresponds to the back surface. The elements such as a transistor, resistor, and capacitor are formed on the front surface of the silicon substrate 1 by using the silicon planar process.

A method of forming the recess of the silicon substrate 1 is the same as in the case of FIG. 1. A point different from the embodiment in FIG. 1 is that the passive element 2 has a protruded portion which takes a part of a terminal as an electrode. The protruded portion is inserted into the recess of the silicon substrate 1. The metal interconnect, interconnect by diffusion at high concentration, or polysilicon interconnect 13 for electrical conduction is formed in advance on the front surface of the recess of the silicon substrate 1. Adhesion of the passive element 2 to the silicon substrate is performed with the use of the conductive adhesive 12 or the like as in Embodiment 1.

In FIG. 4, there is one connecting point of the silicon substrate 1 and the passive element, that is, one protruded portion of the passive element. However, it is apparent that mounting of a passive element having plural terminals can be performed when the number of recesses of the silicon substrate 1 and the number of protrusions of the passive element are increased in correspondence with the number of terminals of the passive element.

Embodiment 3

Figure 5:
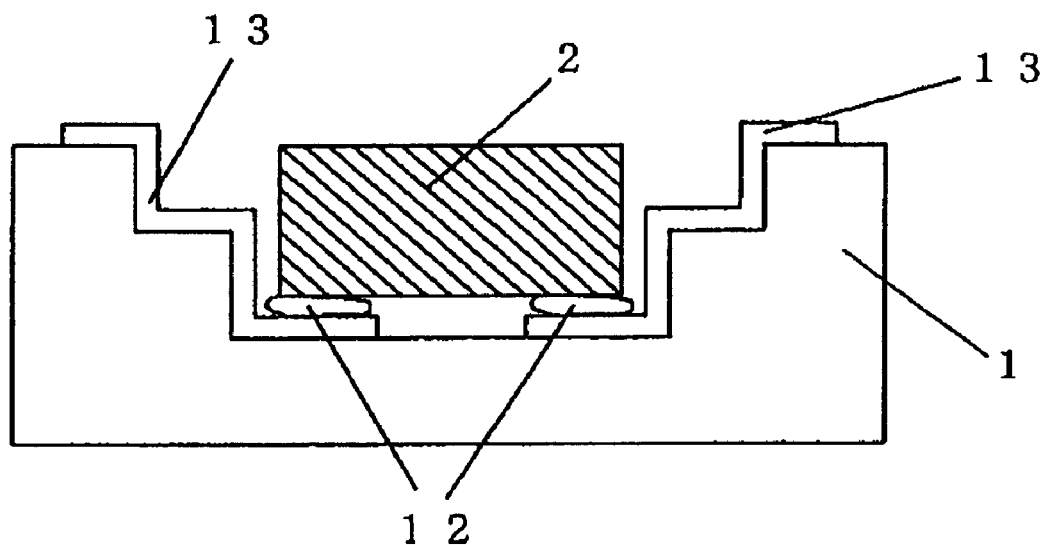
FIG. 5 is a sectional view of an electronic circuit device having a silicon substrate according to Embodiment 3 of the present invention.

FIG. 5 is a sectional view of an electronic circuit device having a silicon substrate according to Embodiment 3 of the present invention. The silicon substrate 1 has a front surface and a back surface. The upper side of FIG. 5 corresponds to the front surface, and the lower side thereof corresponds to the back surface. The elements such as a transistor, resistor, and capacitor are formed on the front surface of the silicon substrate 1 by using the silicon planar process.

A point of difference from the embodiment in FIG. 3 is that the recess of the silicon substrate is stepped with two levels. The shape of the recess thus eases the insertion of the passive element 2 from the front surface of the silicon substrate.

Figure 6:
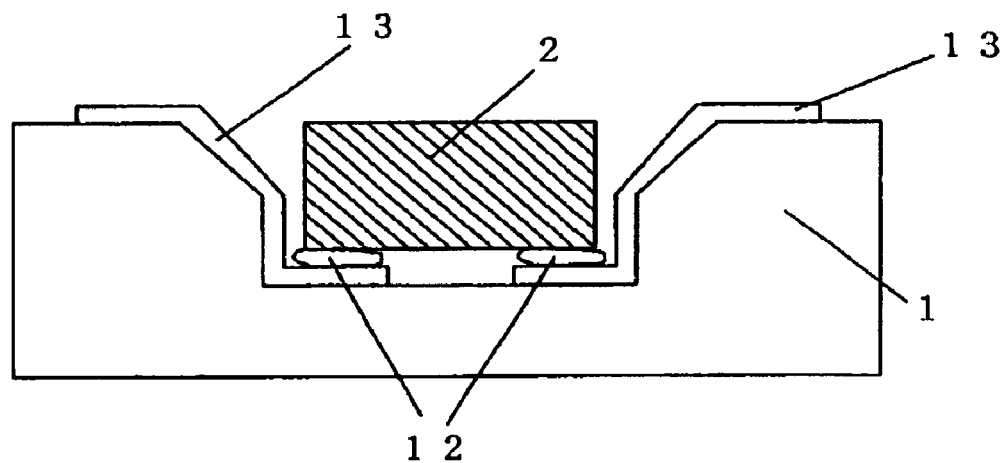
FIG. 6 is a sectional view of the electronic circuit device having the silicon substrate according to Embodiment 3 of the present invention.

Further, as the shape of the recess, a tapered shape can also be made by conducting taper etching through anisotropic wet etching and then-conducting DRIE vertically, as shown in FIG. 6. This structure further eases the insertion of the passive element 2 from the front surface of the silicon substrate.

Figure 7:
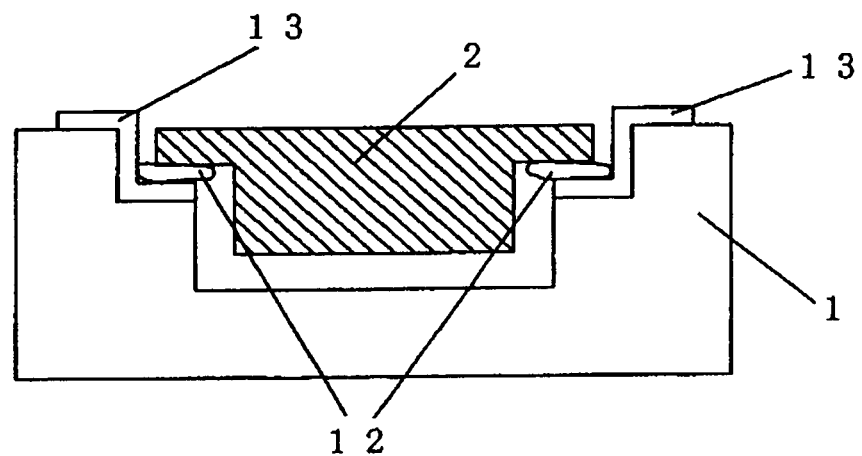
FIG. 7 is a sectional view of the electronic circuit device having the silicon substrate according to Embodiment 3 of the present invention.

Further, FIG. 7 is a sectional view of an electronic circuit device having a silicon substrate in the case where the shape of the passive element 2 has two levels. In this case, the terminals of the passive element 2 are provided at thin portions thereof, and are just fitted to shallow portions of the recess of the silicon substrate 1. With this structure, the insertion of the passive element 2 from the front surface of the silicon substrate and the connection between the passive element 2 and the interconnect 13 can be made easier.

Figure 8:
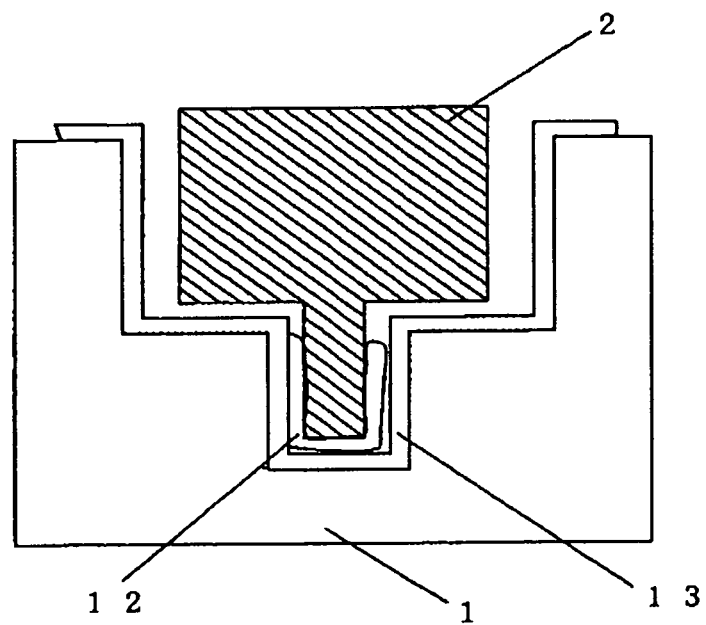
FIG. 8 is a sectional view of the electronic circuit device having the silicon substrate according to Embodiment 3 of the present invention.

Further, in FIG. 8, the passive element 2 has a protruded terminal, and the recess of the silicon substrate 1 is formed to be fitted to the terminal. Points different from the embodiment in FIG. 4 are: that the recess formed in the silicon substrate 1 has a two-level depth; and that the terminal of the passive element and the whole or part of the passive element itself are inserted in the recess of the silicon substrate 1.

From the above, the height of the whole electronic circuit device can be made lower than that in the case of FIG. 4.

Embodiment 4

Figure 9:
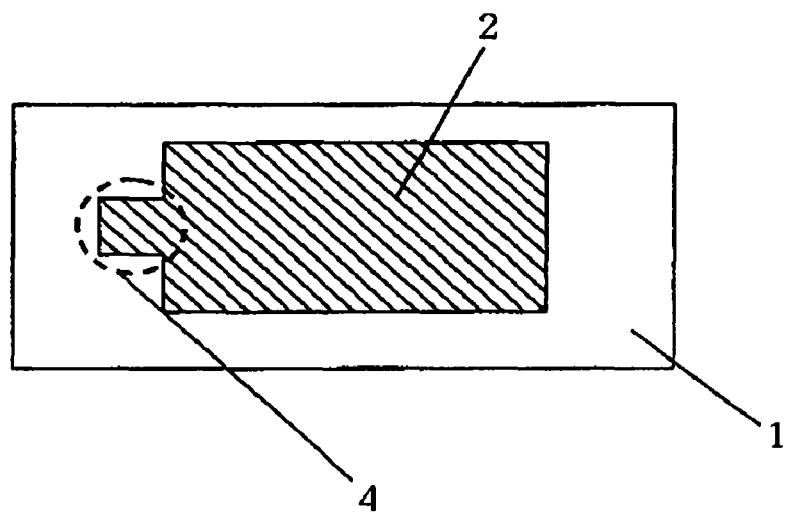
FIG. 9 is a plan view of an electronic circuit device having a silicon substrate according to Embodiment 4 of the present invention.

FIG. 9 is a plan view of an electronic circuit device having a silicon substrate according to Embodiment 4 of the present invention. The silicon substrate 1 has a front surface and a back surface, and FIG. 9 is the plan view of the front surface. The elements such as a transistor, resistor, and a capacitor are formed on the front surface of the silicon substrate 1 by using the silicon planar process. A concave recess 4 is formed in the silicon substrate 1, and a concave portion of the passive element 2 is inserted into the recess 5. In the case where the recess of the silicon substrate has a quadrangular shape, there is a possibility that the passive element is inserted into the silicon substrate in a wrong direction in the state in which the direction of the passive element is rotated by an angle of 180 degrees. However, the insertion of the passive element in the wrong direction can be avoided by providing the concave recess. The electrical connection between the inserted passive element 2 and the silicon substrate 1 is the same as described above.

Embodiment 5

Figure 10:
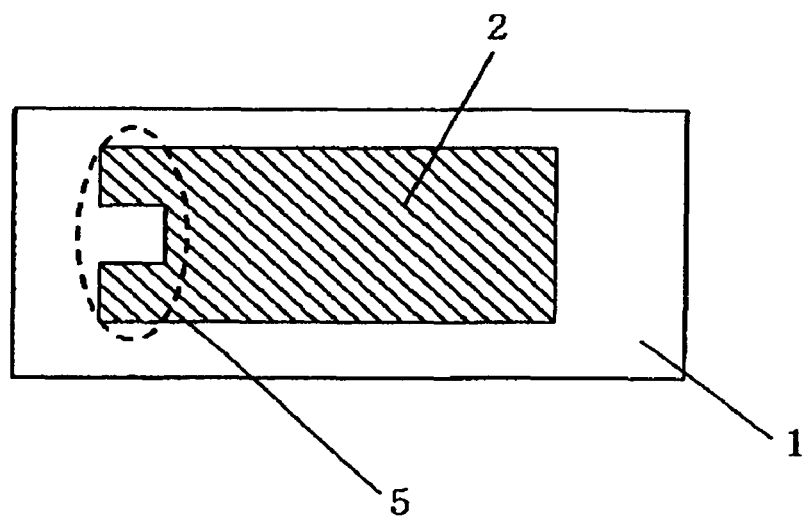
FIG. 10 is a plan view of an electronic circuit device having a silicon substrate according to Embodiment 5 of the present invention.

FIG. 10 is a plan view of an electronic circuit device having a silicon substrate according to Embodiment 5 of the present invention. The silicon substrate 1 has a front surface and a back surface, and FIG. 10 is the plan view of the front surface. The elements such as a transistor, resistor, and a capacitor are formed on the front surface of the silicon substrate 1 by using the silicon planar process. A convex portion 5 is formed in the recess of the silicon substrate 1, and the passive element 2 has a concave portion receiving the convex portion 5. In the case where the recess of the silicon substrate has a quadrangular shape, there is a possibility that the passive element is inserted into the silicon substrate in a wrong direction in the state in which the direction of the passive element is rotated by an angle of 180 degrees. However, the insertion of the passive element in the wrong direction can be avoided by providing the concave portion 5. The electrical connection between the inserted passive element 2 and the silicon substrate 1 is the same as described above.

Embodiment 6

Figure 11:
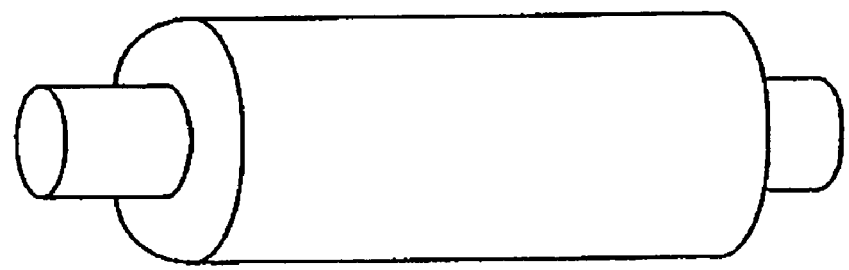
FIG. 11 is a perspective view of a passive element used in an electronic circuit device having a silicon substrate according to Embodiment 6 of the present invention.

FIG. 11 is a stereoscopic view showing the passive element 2 used in Embodiment 6 of the present invention. In FIG. 11, the passive element has a cylindrical shape, and electrodes are formed at both ends thereof. With the cylindrical passive element, the passive element can be easily inserted into the recess of the silicon substrate by being rolled on a wafer in a wafer state.

Figure 12:
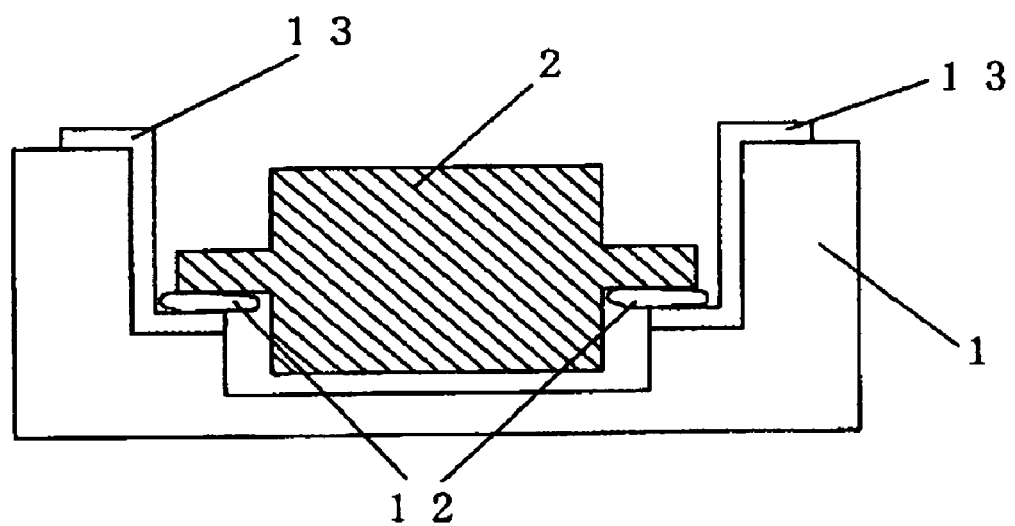
FIG. 12 is a sectional view of the electronic circuit device having the silicon substrate according to Embodiment 6 of the present invention.

FIG. 12 is a sectional view at the time when the passive element in FIG. 11 is inserted into the silicon substrate. In the silicon substrate 1, the recess is made to have a two-level depth as in FIG. 7. The silicon substrate 1 has a front surface and a back surface. The upper side of FIG. 12 corresponds to the front surface, and the lower side thereof corresponds to the back surface. The elements such as a transistor, resistor, and capacitor are formed on the front surface of the silicon substrate 1 by using the silicon planar process. Conduction between the terminals of the passive element 2 and the metal interconnect, interconnect through diffusion at high concentration, or polysilicon interconnect 13 is established through the low-melting metal or conductive adhesive 12. The interconnect 13 electrically connects the terminals to the semiconductor elements formed on the front surface of the silicon substrate 1.

Embodiment 7

Figure 13:
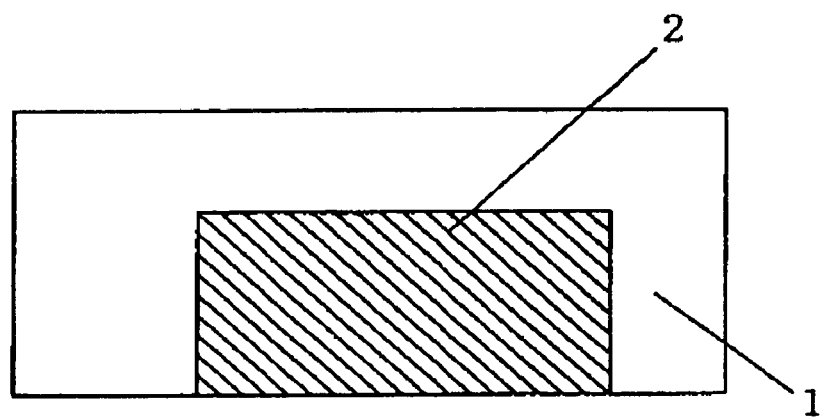
FIG. 13 is a sectional view of an electronic circuit device having a silicon substrate according to Embodiment 7 of the present invention.

FIG. 13 is a sectional view of an electronic circuit device having a silicon substrate according to Embodiment 7 of the present invention. The silicon substrate 1 has a front surface and a rear or back surface forming first and second opposite main surfaces of the silicon substrate. The upper side of FIG. 13 corresponds to the front surface, and the lower side thereof corresponds to the back surface. The elements such as a transistor, resistor, and capacitor are formed on the front surface of the silicon substrate 1 by using the silicon planar process. Points different from the embodiment in FIG. 1 are: that the recess is formed in the back surface of the silicon substrate; and that the passive element 2 is inserted into the recess. The recess is formed in the back surface of the silicon substrate 1, whereby the semiconductor elements can be effectively formed on the front surface of the silicon substrate 1.

In the electronic circuit device in FIG. 13, the electrode of the passive element can be taken out to the lower side of FIG. 13 in the same way as that in FIG. 3.

As to a method of mounting the electronic circuit device in FIG. 13 to a board or the like, a bump is formed on the electrode of either the front surface or the back surface of the silicon substrate, and the resultant is mounted to the substrate with its face down. The opposite electrode is subjected to wire bonding. Thus, the electronic circuit device can be mounted to the substrate or the like. From the viewpoint of flatness, it is easier that the bump is formed on the electrode on the front surface of the silicon substrate 1 while the electrode on the back surface on the passive element side is subjected to wire bonding.

Embodiment 8

Figure 14:
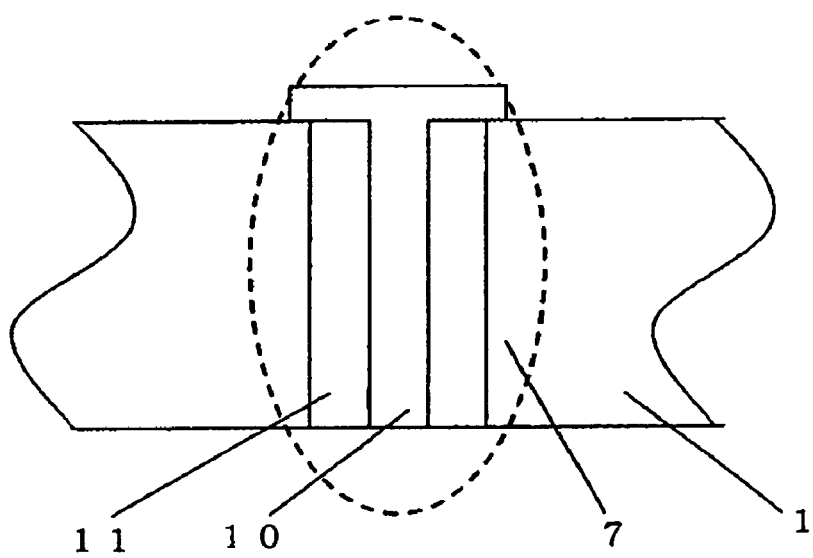
FIG. 14 is a sectional view of a connecting element used in an electronic circuit device having a silicon substrate according to Embodiment 8 of the present invention.

FIG. 14 is a sectional view of a connecting element 7 that connects the front surface (first main surface) to the back (rear) surface second main surface) of the silicon substrate 1 in an electronic circuit device having a silicon substrate according to Embodiment 8 of the present invention. There is a hole that penetrates through the front surface and the back surface of the silicon substrate 1, and the connecting element 7 is entrenched in the through hole. The connecting element 7 has a cylindrical shape, and a metal-like conductive material 10 exists at a center portion thereof. The conductive material 10 has a nail shape, and the connecting element 7 is electrically connected to the terminal of the passive element through a head portion of the nail (refer to FIG. 15). A body portion of the nail-shape conductive material 10 is covered by an insulating resin 11. Electrical insulation between the center conductive material and the silicon substrate 1 formed with the through hole can be maintained by the insulating resin 11. Further, the insulating resin 11 is elastic, and thus, can be deformed in correspondence with the shape of the through hole. The insulating resin 11 is coated with an adhesive, and the connecting element 7 is fixed to the silicon substrate 1 by being inserted into the through hole of the silicon substrate.

Figure 15:
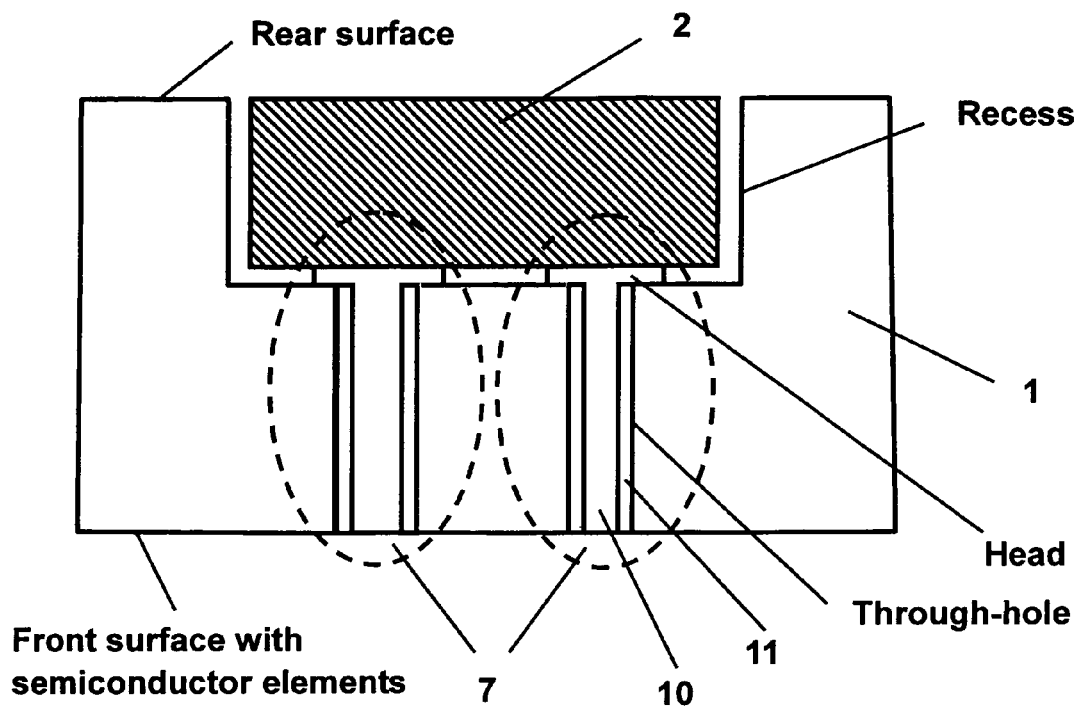
FIG. 15 is a sectional view of the electronic circuit device having the silicon substrate according to Embodiment 8 of the present invention.

FIG. 15 is a sectional view showing the state in which the passive element 2 is mounted to the silicon substrate 1 by using the connecting elements 7. The silicon substrate 1 has a front surface and a back surface. The upper side of FIG. 15 corresponds to the back surface, and the lower side thereof corresponds to the front surface. The elements such as a transistor, resistor, and capacitor are formed on the front surface of the silicon substrate 1 by using the silicon planar process. The recess having a two-level depth is formed in the back surface of the silicon substrate 1. Also, the through holes are formed at two points in the recess, and the connecting elements 7 are inserted into the through holes. The terminals of the passive element 2 are connected with the upper portions (metal head portions of the nails) of the connecting elements 7. Adhesion and electrical connection between the passive element 2 and the upper portions of the connecting elements 7 can be easily realized by using the conductive adhesive or low-melting metal.

The terminals of the passive element 2 are pulled out to the front surface of the silicon substrate 1 through the connecting elements 7. In FIG. 15, the semiconductor elements are formed on the front surface of the silicon substrate, and the semiconductor elements and the metal lower portions of the connecting elements 7 are electrically connected to each other through wire bonding or the like. From the above, even if the passive element is entrenched in the back surface on which the semiconductor elements are not formed, the terminals of the passive element can be electrically pulled out to the front surface on which the semiconductor elements are formed. Therefore, the passive element can be connected to the semiconductor elements on the front surface on which the semiconductor elements are formed.

Embodiment 9

Figure 16:
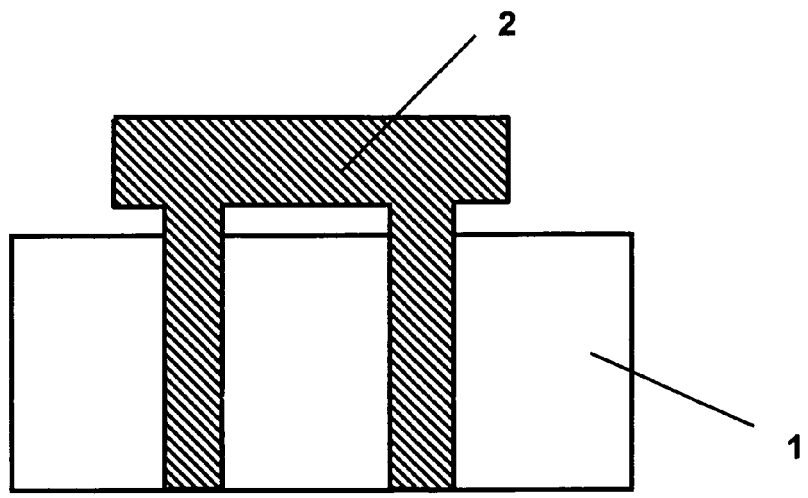
FIG. 16 is a sectional view of an electronic circuit device having a silicon substrate according to Embodiment 9 of the present invention.

FIG. 16 is a sectional view of an electronic circuit device having a silicon substrate according to Embodiment 9 of the present invention. The silicon substrate 1 has a front surface and a back surface. The upper side of FIG. 16 corresponds to the front surface, and the lower side thereof corresponds to the back surface. The elements such as a transistor, resistor, and capacitor are formed on the front surface of the silicon substrate 1 by using the silicon planar process. Further, the through holes are formed in the silicon substrate 1. The passive element 2 is provided with protrusions having terminals which fit into the throughholes, and the protrusions of the passive element 2 are inserted into the through holes from the front surface of the silicon substrate 1. The connection between the passive element 2 and the semiconductor elements is the same as that in Embodiment 2. Moreover, in FIG. 16, in the case where the recess is formed in the back surface on which the semiconductor elements are not formed (in the case where the passive element 2 is inserted from the back surface of the silicon substrate), the terminals at tip end portions of feet of the passive element 2 are electrically connected to the semiconductor elements on the front surface of the silicon substrate, on which the semiconductor elements are formed, through wire bonding.

Embodiment 10

Figure 17:
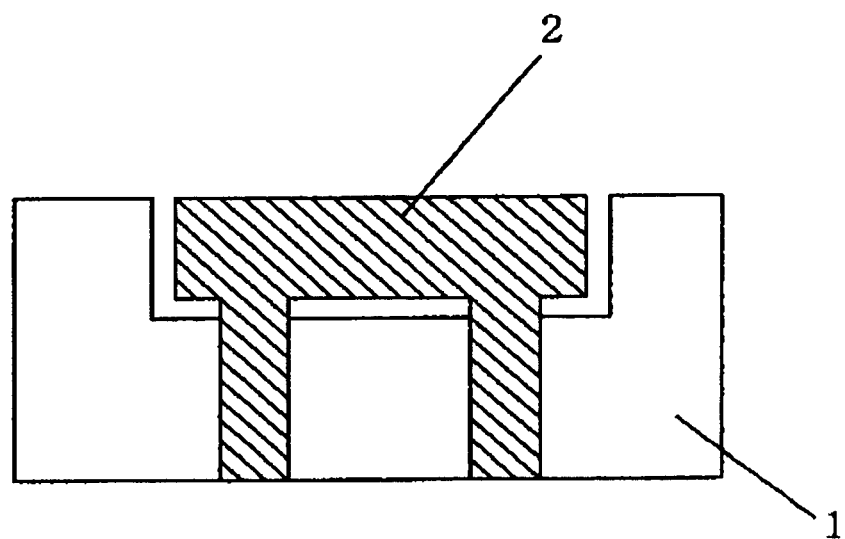
FIG. 17 is a sectional view of an electronic circuit device having a silicon substrate according to Embodiment 10 of the present invention.

FIG. 17 is a sectional view of an electronic circuit device having a silicon substrate according to Embodiment 10 of the present invention. A point different from the embodiment in FIG. 16 is that the recess of the silicon substrate 1 has two levels in a depth direction. From this, a part or the whole of the passive element 2 is kept in the recess of the silicon substrate 1. Accordingly, the height of the electronic circuit device can be reduced.

Embodiment 11

Figure 18:
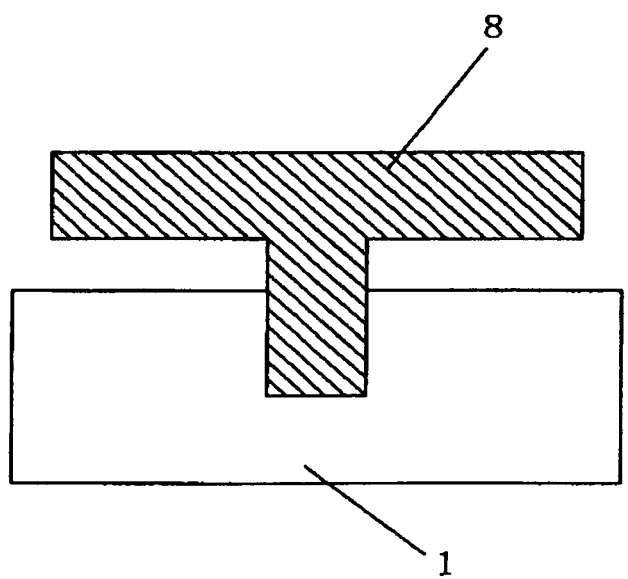
FIG. 18 is a sectional view of an electronic circuit device having a silicon substrate according to Embodiment 11 of the present invention.
Figure 19:
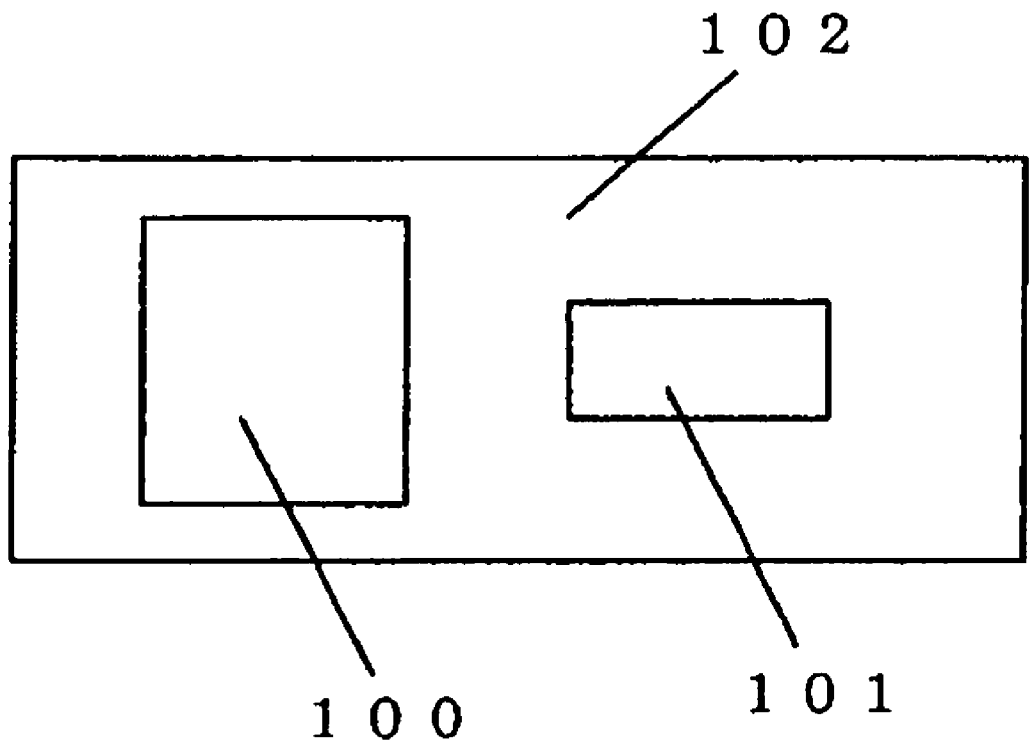
FIG. 19 is a plan view of a conventional electronic circuit device having a silicon substrate.

FIG. 18 is a sectional view of an electronic circuit device having a silicon substrate according to Embodiment 11 of the present invention. A point different from the embodiment in FIG. 4 is that an antenna 8 is inserted into the recess of the silicon substrate 1 instead of the passive element.

In general it is difficult to form a high performance antenna on a silicon substrate by using the silicon planar process. However, the high performance antenna, which is manufactured by a process different from the silicon planar process, is entrenched in the silicon substrate. As a result, there can be manufactured a compact electronic circuit device having a transmitting-receiving function with high communication sensitivity.

Entrenching of the passive element in the silicon substrate has been described above. However, a sensor element is entrenched in the silicon substrate instead of the passive element, whereby there can be structured a compact electronic circuit device having a sensor with high sensitivity. For example, a magnetic material for detecting magnetism is attached onto a silicon substrate having a signal processing circuit; a magnetic sensor for detecting magnetism, which has higher sensitivity than that of a magnetic sensor integrally formed with the silicon substrate, is manufactured by a process different from the silicon planar process; and the resultant magnetic sensor is inserted into the silicon substrate having the signal processing circuit. Resultingly, a compact magnetic sensor with high sensitivity can be constructed.

Further, in general, an output of a sensor generally often has high impedance. This case may bring a problem in noise resistance when interconnect is drawn. However, in the present invention, the terminal of the sensor can be directly connected with the silicon substrate, which clearly improves noise resistance.

Further, an MEMS (Micro Electro Mechanical System) component including a sensor and a signal processing circuit or electronic component including a semiconductor element is entrenched in the silicon substrate instead of the passive element, whereby the electronic circuit device can be reduced in size. For example, the MEMS component including a sensor and a function of converting an output of the sensor into impedance is entrenched in a semiconductor substrate having a signal processing circuit, and an output of the MEMS component is electrically connected to an input of the signal processing circuit on the semiconductor substrate. Accordingly, an electronic circuit device having a small MEMS component can be constructed.

Moreover, an electronic component having a semiconductor element formed on a different semiconductor substrate is entrenched in another semiconductor substrate. A compact electronic circuit device can thus be constructed.

As described above, according to the present invention, in an electronic circuit device having a silicon substrate, an electronic component including a passive element, sensor element, antenna, or MEMS, which is formed by the process different from the planar process of the silicon substrate, is entrenched in the silicon substrate. Accordingly, an extremely compact high performance electronic circuit device can be provided.

What is claimed is:

1. An electronic circuit device, comprising:
a silicon substrate having a semiconductor element formed on a front surface thereof, a recess formed in a rear surface thereof, and at least one through-hole in the recess and which penetrates through the front surface and the rear surface;
at least one passive element disposed in the recess and formed by a process different from a silicon planar process by which the semiconductor element is formed; and
at least one connecting element disposed in the through-hole of the silicon substrate for electrically connecting the semiconductor element to the passive element, a surface of the connecting element being covered by an insulating resin.

2. An electronic circuit device according claim 1; wherein the at least one through-hole comprises a pair of through-holes penetrating through the front and rear surfaces of the silicon substrate; and wherein the at least one connecting element comprises a pair of connecting elements disposed in the respective through-holes of the silicon substrate for electrically connecting the semiconductor element to the passive element, a surface of each of the connecting elements being covered by an insulating resin.

3. An electronic circuit device according to claim 2; wherein each of the connecting elements comprises a body portion extending in the corresponding through-hole and a head portion extending from one end of the body portion and disposed outside of the through-hole and in the recess for electrical connection to a terminal of the passive element; and wherein the body portion of each of the connecting elements is covered by the corresponding insulating resin.

4. An electronic circuit device according to claim 1; wherein the connecting element comprises a body portion extending in the through-hole and a head portion extending from one end of the body portion and disposed outside of the through-hole and in the recess for electrical connection to a terminal of the passive element;
and wherein the body portion of the connecting element is covered by the insulating resin.

5. An electronic circuit device comprising:
a silicon substrate having a first main surface, a second main surface opposite the first main surface, a recess formed in the second main surface and having a base portion, and at least one through-hole penetrating through the base portion of the recess and opening to the first main surface;
a semiconductor element formed on the first main surface of the silicon substrate;
at least one passive element disposed in the recess of the silicon substrate; and at least one connecting element disposed in the through-hole of the silicon substrate for electrically connecting the semiconductor element to the passive element.

6. An electronic circuit device according to claim 5; wherein the semiconductor element is formed by a silicon planar process; and wherein the passive element is not formed by the silicon planar process from which the semiconductor element is formed.

7. An electronic circuit device according to claim 5; wherein the at least one through-hole comprises a pair of through-holes penetrating through the base portion of the recess of silicon substrate; and wherein the at least one connecting element comprises a pair of connecting elements disposed in the respective through-holes of the silicon substrate for electrically connecting the semiconductor element to the passive element.

8. An electronic circuit device according to claim 7; wherein each of the connecting elements comprises a body portion extending in the corresponding through-hole, an insulating resin covering the body portion, and a head portion extending from one end of the body portion and disposed outside of the through-hole and in the recess for electrical connection to a terminal of the passive element.

9. An electronic circuit device according to claim 5; wherein the connecting element comprises a body portion extending in the through-hole, an insulating resin covering the body portion, and a head portion extending from one end of the body portion and disposed outside of the through-hole and in the recess for electrical connection to a terminal of the passive element.

10. An electronic circuit device according to claim 5; wherein the passive element is disposed completely within the recess of the silicon substrate.

11. An electronic circuit device according to claim 5; wherein the passive element comprises a pre-formed structure that is separate and independent from the silicon substrate, the semiconductor element, and the connecting element.

12. An electronic circuit device according to claim 5; wherein the passive element comprises a pre-formed non-silicon-based passive element.

13. An electronic circuit device according to claim 12; wherein the connecting element comprises a body portion extending in the through-hole, an insulating resin covering the body portion, and a head portion extending from one end of the body portion and disposed outside of the through-hole and in the recess for electrical connection to a terminal of the passive element.

14. An electronic circuit device according to claim 12; wherein the connecting element has a surface comprised of an insulating resin.

* * * * *